(12) United States Patent
Kuroda et al.

(10) Patent No.: US 6,879,258 B2
(45) Date of Patent: Apr. 12, 2005

(54) IC CARD HAVING A MICA FILM FOR STABLE RESONANCE FREQUENCY AND ENHANCED ANTENNA PROPERTIES

(75) Inventors: Nobukazu Kuroda, Kanuma (JP); Kazuaki Suzuki, Kanuma (JP)

(73) Assignee: Sony Chemicals Corp., Tokyo (JP)

( * ) Notice: Subject to any disclaimer, the term of this patent is extended or adjusted under 35 U.S.C. 154(b) by 0 days.

(21) Appl. No.: 10/736,603

(22) Filed: Dec. 17, 2003

(65) Prior Publication Data

US 2004/0124983 A1 Jul. 1, 2004

Related U.S. Application Data

(63) Continuation of application No. 09/615,653, filed on Jul. 13, 2000, now abandoned.

(30) Foreign Application Priority Data

Jul. 29, 1999 (JP) ............................................. 11-214954

(51) Int. Cl.[7] ............................................. G08B 13/14
(52) U.S. Cl. ............................... 340/572.1; 340/572.5; 340/572.7; 340/573.1; 340/573.4; 340/10.33; 340/10.34; 340/10.42
(58) Field of Search ............................ 340/572.1, 572.5, 340/572.7, 573.1, 573.4, 10.33, 10.34, 10.42

(56) References Cited

U.S. PATENT DOCUMENTS

| | | | |
|---|---|---|---|
| 5,055,968 A | 10/1991 | Nishi et al. | |
| 5,313,052 A | 5/1994 | Watanabe et al. | |
| 5,442,334 A | 8/1995 | Gallo et al. | |
| 5,453,727 A | 9/1995 | Shibasaki et al. | |
| 5,523,749 A | 6/1996 | Cole et al. | |
| 5,608,417 A | 3/1997 | De Vall | |
| 5,705,852 A | 1/1998 | Orihara et al. | |
| 5,708,419 A | 1/1998 | Isaacson et al. | |
| 5,852,289 A | 12/1998 | Masahiko | |
| 5,862,039 A | 1/1999 | Oertel | |
| 5,880,934 A | 3/1999 | Haghiri-Tehrani | |
| 5,883,582 A | 3/1999 | Bowers et al. | |
| 6,043,746 A | 3/2000 | Sorrells | |
| 6,126,077 A | 10/2000 | Tanaka et al. | |
| 6,194,993 B1 | 2/2001 | Hayashi et al. | |

FOREIGN PATENT DOCUMENTS

| EP | 0 737 935 A | 2/1986 |
|---|---|---|
| JP | A 60 194625 | 10/1985 |
| JP | A 04 014282 | 1/1992 |
| JP | A 10 203060 | 8/1998 |

*Primary Examiner*—Tai T. Nguyen
(74) *Attorney, Agent, or Firm*—Oliff & Berridge, PLC

(57) ABSTRACT

An IC card 10A has a mica capacitor that comprises a mica film 1 and electrodes 6a, 6b formed on both sides thereof, where the mica film 1 serves as a mounting substrate for an antenna coil 2 and an IC chip 3, thereby reducing profile of an IC card and also reducing its cost of manufacture and to stabilize its resonance frequency.

3 Claims, 8 Drawing Sheets

(x—x cross-section)

(y—y cross-section)

(x – x cross-section)

(y – y cross-section)

(x—x cross-section)

(y—y cross-section)

IC CARD HAVING A MICA FILM FOR STABLE RESONANCE FREQUENCY AND ENHANCED ANTENNA PROPERTIES

INCORPORATION BY REFERENCE

This is a Continuation of application Ser. No. 09/615,653 filed Jul. 13, 2000, now abandoned. The entire disclosure of the prior application is hereby incorporated by reference herein in its entirety.

BACKGROUND OF THE INVENTION

1. Field of the Invention

The present invention relates to RFID (Radio Frequency Identification) or other non-contact type IC cards.

2. Description of the Related Art

Data carrier systems in which signal transmission/reception is conducted by causing an induced voltage to be generated in the antenna coil of a responder (non-contact type IC card) without any contact, by means of electromagnetic waves produced by an interrogator (reader/writer), are widespread.

The principal circuit element of these non-contact type IC cards comprises an IC chip, and a resonance circuit that comprises a capacitor and an antenna coil, as shown in FIG. 9. Accordingly in its essential structure, the antenna coil, capacitor and IC chip are disposed on a substrate.

Such antenna coils have conventionally taken the form of a thin metallic wire that is wound in the shape of a ring on the same surface. However, recent years have seen the increased use of an etched ring-shaped layer of copper foil or other conductive material that has been laminated on one side of the insulating substrate, in order to improve the antenna properties and mechanical strength as well as to reduce the number of steps required in manufacture.

In addition, polyimide films have been widely used as the insulating substrate of the laminated sheet that forms the antenna coil, or as a capacitor dielectric.

However, polyimide has a high water-absorption rate and its dielectric constant can be changed by absorbed moisture. It therefore creates problems, in capacitors in which polyimide films are used as dielectrics, that the electrostatic capacity is affected by moisture absorption and IC card resonance frequency deviates.

When the capacitor is formed from a laminated sheet in which the copper foil is bonded to the polyimide film using an adhesive in particular, the adhesive will, in addition to the polyimide film, also cause the dielectric constant to fluctuate, which results in a virtually unstable resonance frequency in the IC card.

SUMMARY OF THE INVENTION

With the foregoing problems of the related art in view, it is an object of the present invention to manufacture an IC card that has a stable resonance frequency and enhanced antenna properties, at low cost.

The inventors perfected the present invention based on the discovery that by using as the capacitor a mica capacitor in which a mica film is used as a dielectric, the resonance frequency of the IC card can be stabilized as a result of the remarkably low water absorption rate of the mica film and furthermore, that by using a mica film, which acts as a dielectric of the mica capacitor, as a substrate onto which the antenna coil and IC chip can be formed or mounted, the IC card can be manufactured with a thinner profile and at lower cost.

The present invention provides an IC card, comprising: a mica capacitor which comprises a mica film and electrodes formed on both sides thereof; an antenna coil; and IC chip, where said mica film acts as a substrate on which said antenna coil and said IC chip are provided.

Other objects and features of the present invention will be described or become apparent from the following disclosure.

DESCRIPTION OF THE PREFERRED EMBODIMENTS

Figure 1A:
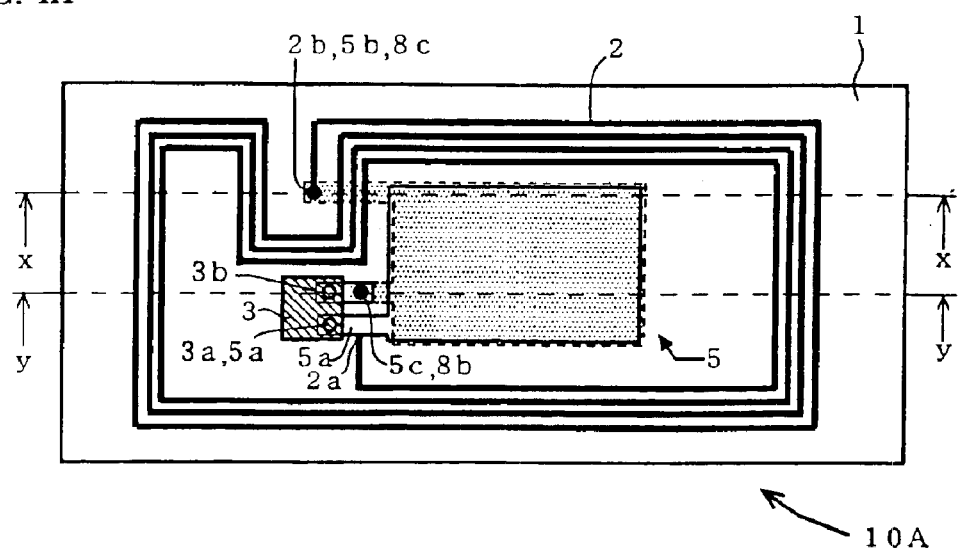
FIGS. 1A to 1C show a top view (1A) and cross-sectional views ((1B) and (1C)) of the IC card pertaining to the present invention.

The present invention is described in further detail below, with reference to the drawings. In the drawings, the same symbols depict the same or similar structural elements.

Figure 5A:
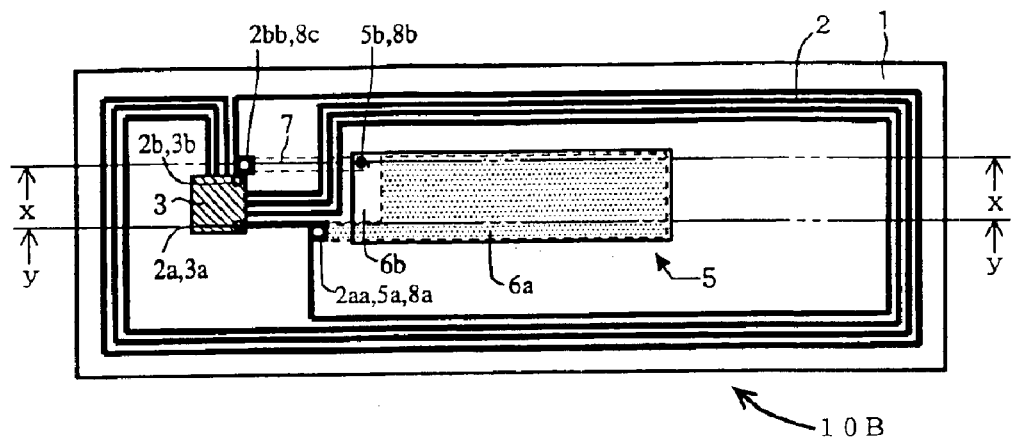
FIGS. 5A to 5C show a top view (5A) and cross-sectional views ((5B) and (5C)) of the IC card pertaining to the present invention.
Figure 5B:
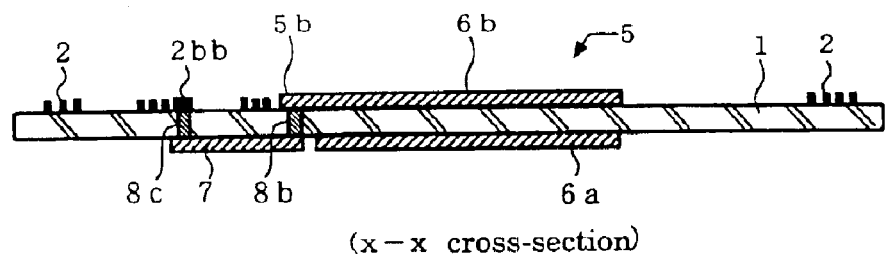
Figure 5C:
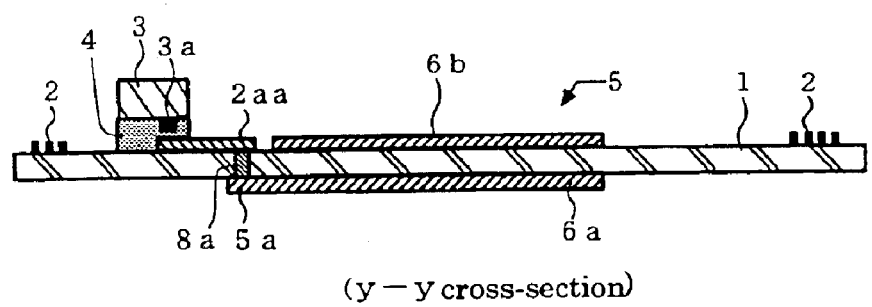
Figure 6A:
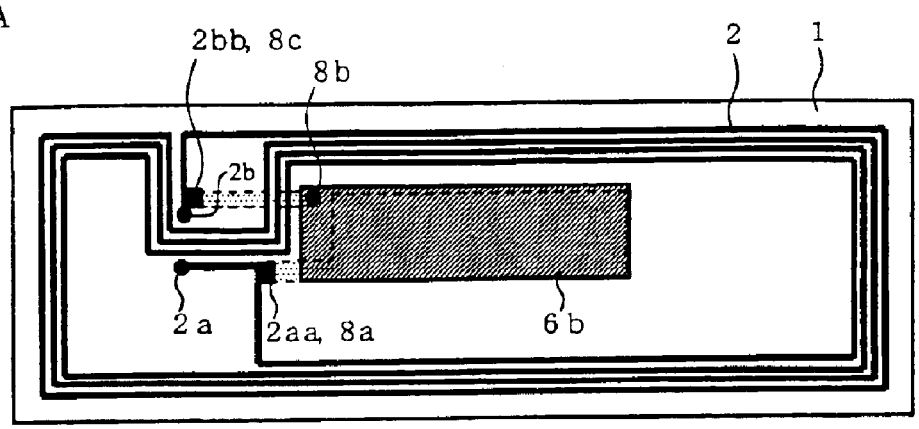
FIGS. 6A and 6B show a top view (6A) and a bottom view (6B) of the IC card prior to IC chip mounting.
Figure 6B:
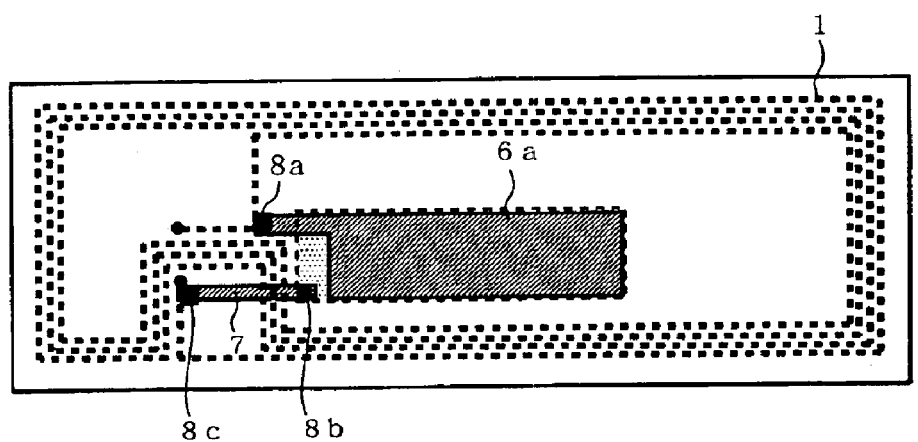

FIGS. 5A, 5B and 5c show an IC card 10B as an embodiment of the present invention in a top view (5A) and cross-sectional views (5B) and (5C). FIGS. 6A and 6B show a top view (6A) and a bottom view (6B) of the IC card 10B prior to mounting of the IC chip 3.

The IC card 10B is provided with an antenna coil 2 and an IC chip 3 on one side of a transparent mica film 1. Electrodes 6a, 6b are formed on both sides of the mica film 1, and a mica capacitor 5 is constituted from these electrodes 6a, 6b and the mica film 1, which is sandwiched between the electrodes 6a, 6b. The dotted portion that appears in the mica capacitor 5 in FIG. 5A indicates the electrode 6a, which is formed on the bottom surface of the mica film 1.

The antenna coil 2 in the IC card 10B can be printed on the mica film 1 in a coil pattern using a silver or other conductive paste, or can be formed by etching the conductive layer of a laminated sheet comprising a copper or other conductive layer formed on the surface of the mica film 1.

The IC chip 3 is mounted in a facedown fashion on the mica film 1 using an anisotropically conductive adhesive 4. The IC chip 3 is mounted in such a manner that it steps over the antenna coil 2 between the IC chip terminals 3a and 3b, resulting in one terminal 3a contacting an inner terminal 2a of the antenna coil 2, and the other terminal 3b contacting an outer terminal 2b of the antenna coil 2.

The mica capacitor 5 is constituted from the mica film 1 and the electrodes 6a and 6b formed on both sides thereof.

Of the electrodes 6a, 6b, the capacitor terminal 5a is formed on the electrode 6a, which has been formed on the bottom side of the mica film 1, and the capacitor terminal 5a is connected to the inner terminal 2aa of the antenna coil 2 via a through-hole 8a. The capacitor terminal 5b is formed on the electrode 6b of the mica capacitor 5, which has been formed on the top side of the mica film 1, and the capacitor terminal 5b is connected to wiring 7, which has been formed on the bottom side of the mica film 1, via a through-hole 8b. The wiring 7 is connected to an outer terminal 2bb of the antenna coil 2 via a through-hole 8c.

The IC card 10B as shown in FIGS. 5A to 5C can be manufactured, for example, as described below.

First, as shown in FIG. 6A, holes are formed for the through-holes 8a, 8b, 8c in the mica film 1, after which the electrode 6b on the top side of the mica capacitor 5 and the antenna coil 2 are printed on one side of the mica film 1, using a silver or other conductive paste. Then, as shown in FIG. 6B, the electrode 6a on the bottom side of the mica capacitor 5 and the wiring 7 are printed on the other side of the mica film 1. Printing the conductive paste fills the through-holes 8a, 8b, 8c with the conductive paste, causes passage through the through-holes 8a, 8b, 8c, and completes the connection between the antenna coil 2 and the mica capacitor 5.

Next, the IC chip 3 is mounted in facedown fashion on the topside of the mica film 1 using an anisotropically conductive adhesive 4. Any conventionally known adhesive may be used as this anisotropically conductive adhesive 4, and it may come in the form of a film, paste or any other form.

Using a mica film 1 as a dielectric of the capacitor 5 in the IC card 10B thus obtained prevents any deviation from occurring in the resonance frequency owing to absorbed moisture and improves the antenna characteristics. Furthermore, the fact that the mica film 1 serves as the mounting substrate of the antenna coil 2 and the IC chip 3 allows the selected IC chip to have a thinner profile than conventional IC chips where the mounting substrate is an entity separate from the dielectric of the capacitor 5. Moreover, by using the conductive paste, it is possible to form at the same time both the electrodes 6a, 6b of the capacitor 5 and the antenna coil 2 as well as the wiring 7 and through-holes 8a, 8b, 8c which are necessary for these to be connected, thereby making unnecessary any process for connecting them. This allows the manufacturing process to be streamlined and the IC chips to be produced at low cost.

Figure 1B:
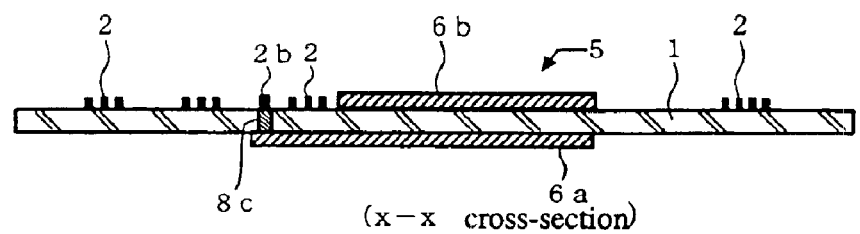
Figure 1C:
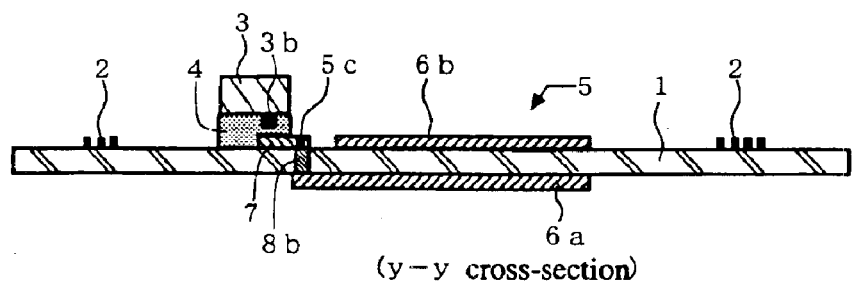
Figure 2A:
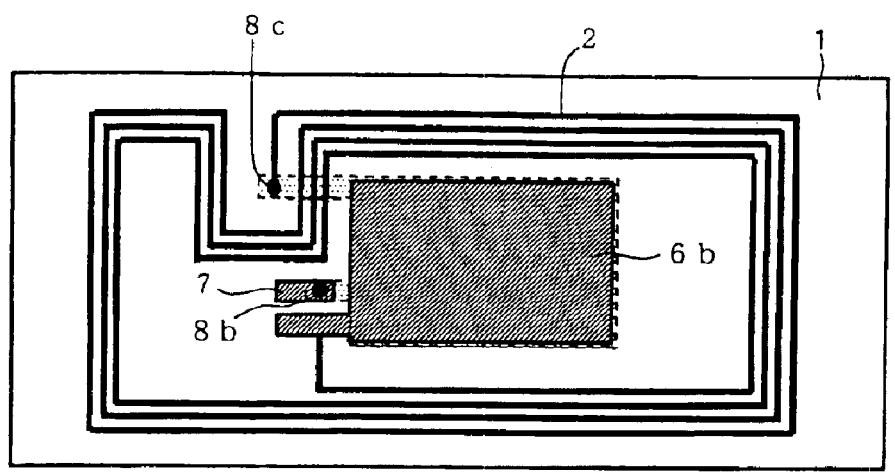
FIGS. 2A and 2B show a top view (2A) and a bottom view (2B) of the IC card prior to IC chip mounting.
Figure 2B:
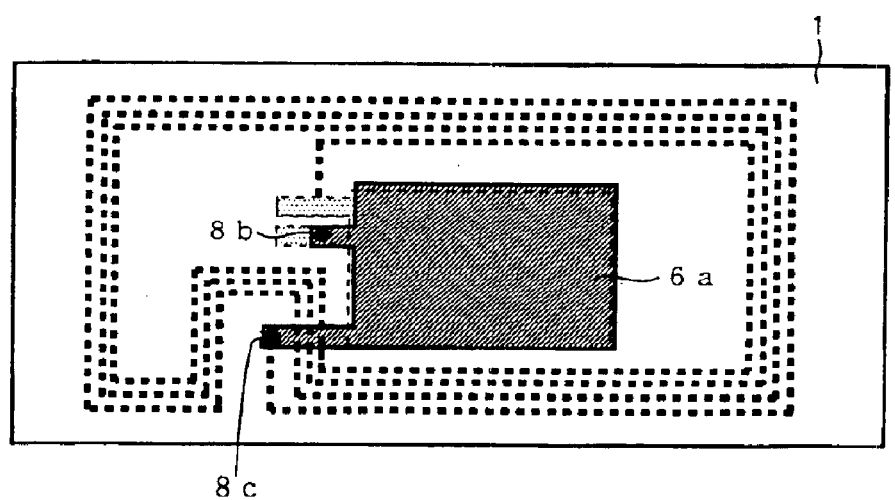

FIGS. 1A to 1C depict an IC card 10A pertaining to a further embodiment of the present invention in a top view (1A) and in cross-sectional views ((1B) and (1C)). The dotted portion in the mica capacitor 5 in FIG. 1A refers to the electrode 6a, which has been formed on the bottom side of the mica film 1. FIGS. 2A and 2B show a top view (2A) and a bottom view (2B) of the IC card 10A prior to mounting of the IC chip 3.

This IC card 10A is manufactured in essentially the same way as the aforementioned IC card 10B, while the capacitor terminal 5c, which is connected to the terminal 3b of the IC chip 3 via the wiring 7 and the through-hole 8b, is furnished from the electrode 6a on the bottom side of the mica film 1, in addition to the capacitor terminal 5b which is connected to the outer terminal 2b of the antenna coil 2 via the through-hole 8c. On the other hand, a capacitor terminal 5a, which is connected to the other terminal 3a of the IC chip 3, is formed from the electrode 6b on the top side of the mica film 1, and this capacitor terminal 5a is linked to the inner terminal 2a of the antenna coil 2. Therefore, according to this IC card 10A, when the two terminals 3a and 3b of the IC chip 3 are respectively connected to the inner terminal 2a and the outer terminal 2b of the antenna coil 2, the IC chip 3 does not need to step over the antenna coil 2 between the two terminals 3a and 3b. It is also unnecessary for the total winding width of the antenna coil 2 to be kept between the two terminals 3a and 3b of the IC chip 3. According to this IC card 10A, therefore, considerable latitude is provided for the design of the antenna coil 2.

Figure 3:
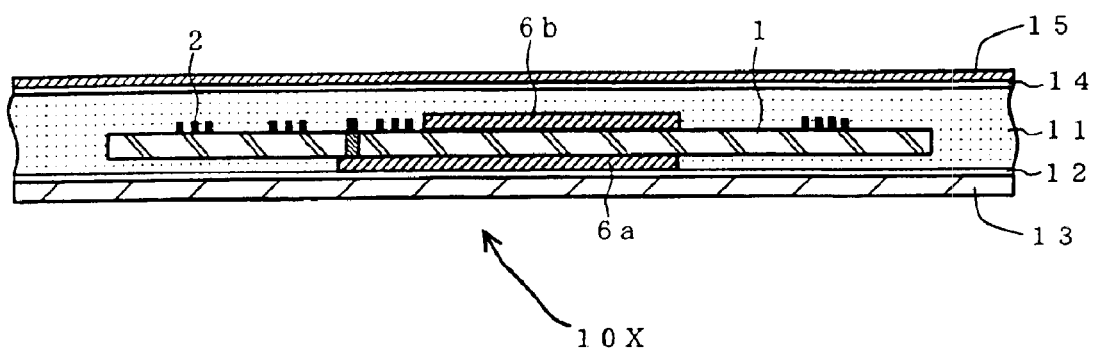
FIG. 3 shows a cross-sectional view of a label which uses the IC card pertaining to the present invention.

The IC card pertaining to the present invention can be sealed with a resin as necessary, or any desired sheet material can be laminated onto either the top or bottom side of the IC card. As an example, FIG. 3 shows an IC card in which the IC card 10A shown in FIGS. 1A to 1C is sealed with a sealing resin 11 comprising an epoxy or other thermosetting resin, or a polyester or other hot melt resin, one side thereof being laminated with a outer layer film 13 of polyester or the like via an acrylic resin or other adhesive 12 and the other side of same being laminated with a release paper 15 via an adhesive 14, thereby constituting a label with identification function 10X which can be affixed to video films or other various articles. In other words, when the label 10X is affixed to the article, the release paper 15 is peeled away, leaving a surface with the adhesive 14 affixed to the article and on the other hand a label surface having an outer layer film 13 which can be written on.

Figure 4:
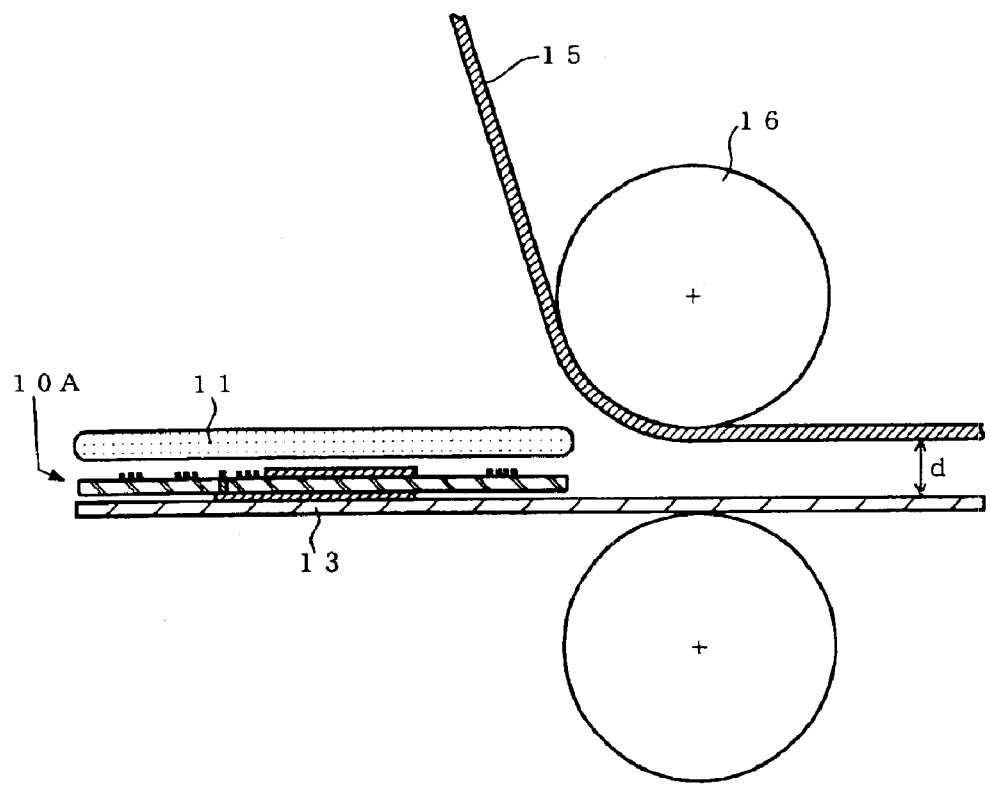
FIG. 4 shows a description diagram of a method for manufacturing a label, using the IC card pertaining to the present invention.

A method for manufacturing a label 10X which uses such an IC card 10A can be seen in FIG. 4, where an outer film 13 is affixed to one side of the IC card 10A via an adhesive (not shown), a sealing resin is applied to the opposite side, and an adhesive-backed release paper 15 is applied thereon using a roller 16, as heat and pressure are applied. In such a case, the space between the outer layer film 13 and the release paper 15 can be adjusted to a specific width d. The label 10X shown in FIG. 3 can be thereby obtained.

Figure 7A:
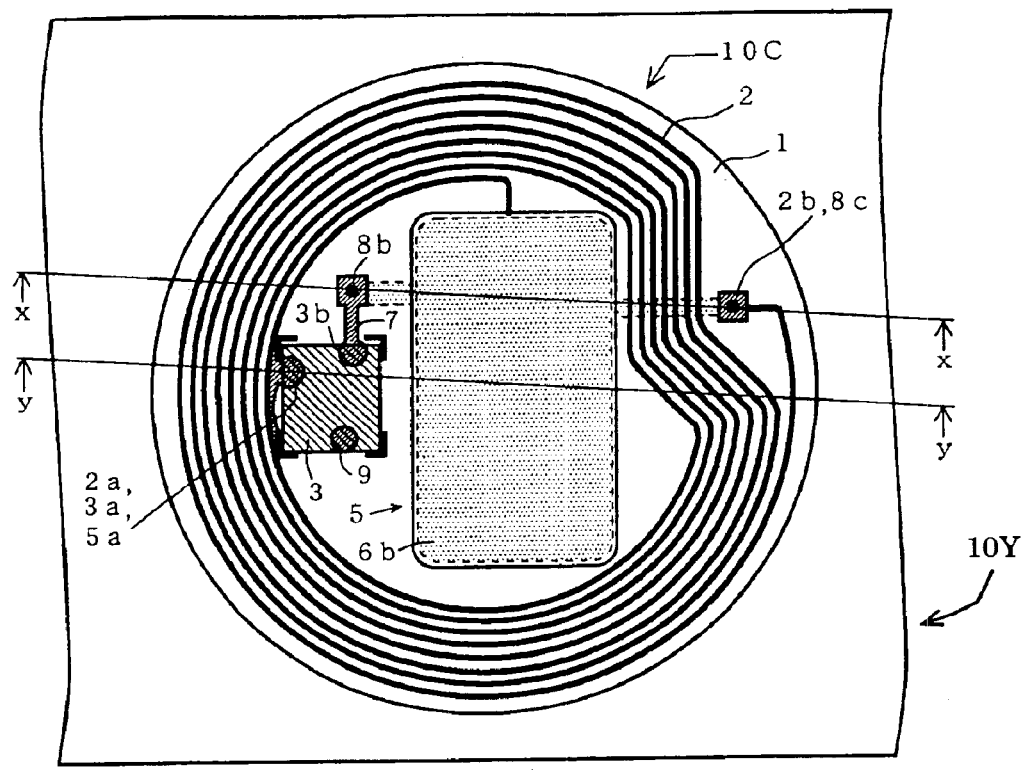
FIGS. 7A to 7C shows a top view (A) and cross-sectional views ((7B) and (7C)) of a label which uses the IC card pertaining to the present invention.
Figure 7B:
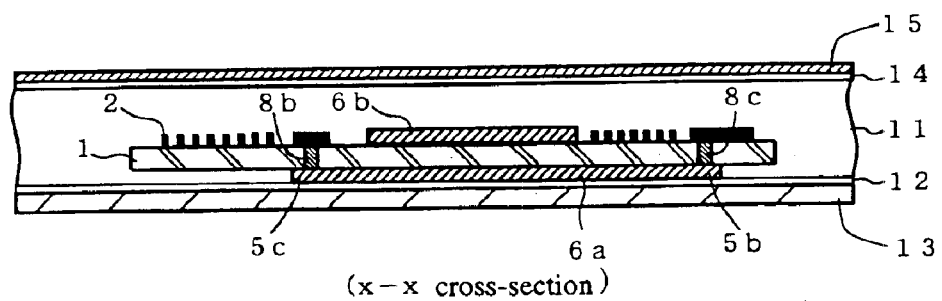
Figure 7C:
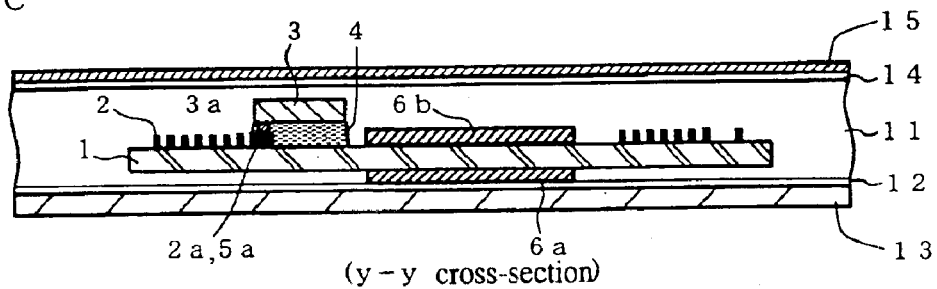
Figure 8A:
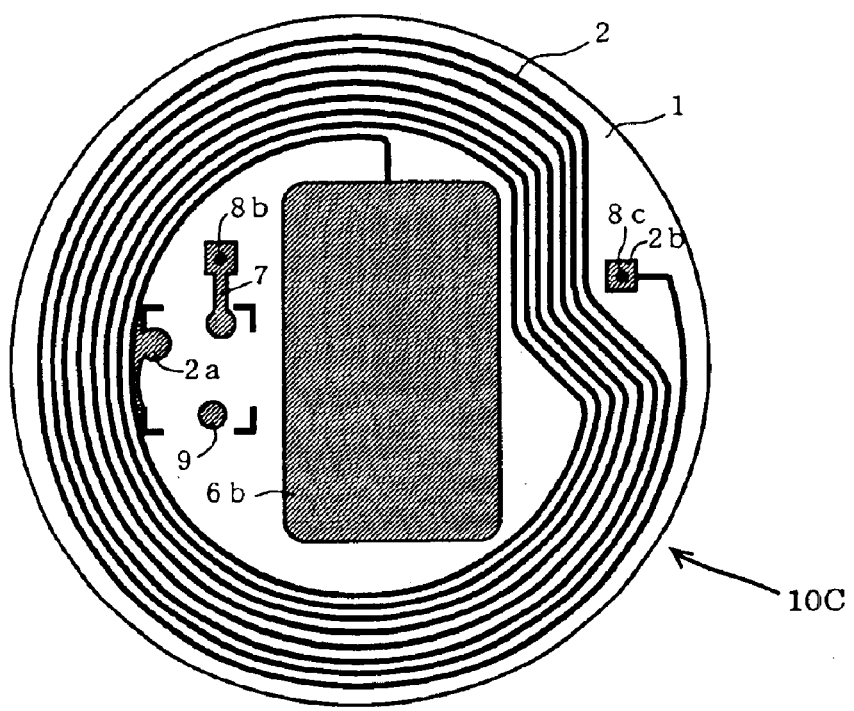
FIGS. 8A and 8B show a top view (8A) and a bottom view (8B) of the IC card prior to IC chip mounting.
Figure 8B:
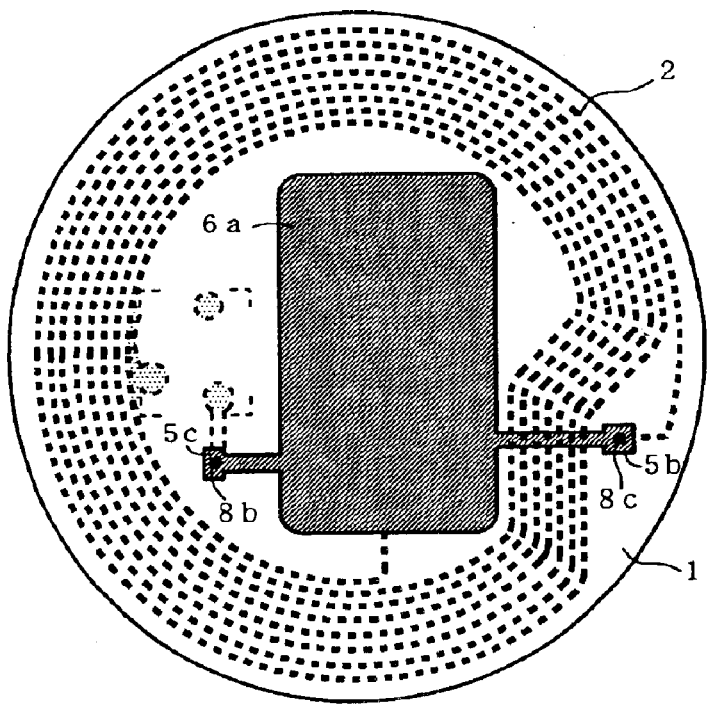
Figure 9:
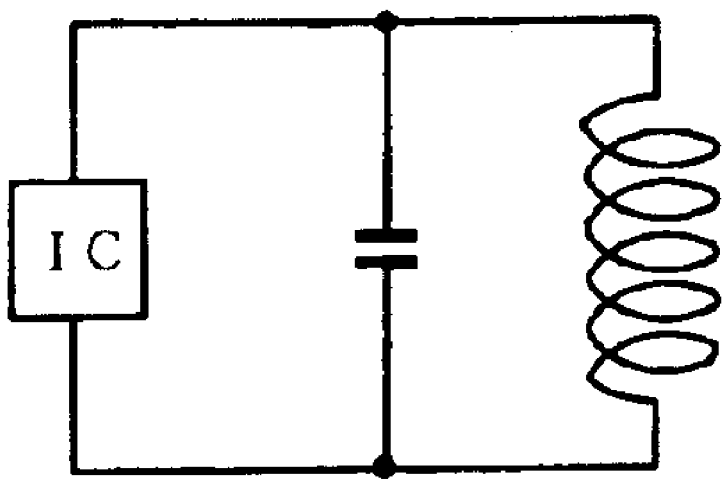
FIG. 9 shows a descriptive diagram of the fundamental circuit elements in the IC card.

FIGS. 7A to 7C depict an IC card 10C pertaining to a further embodiment of the present invention configured as a label 10Y in a top view (7A) and in cross-sectional views ((7B) and (7C)). FIGS. 8A and 8B show a top view (8A) and bottom view (8B) of the IC card 10C prior to mounting of the IC chip 3.

Although this IC card 10C has an antenna coil 2 which is circularly wound, as opposed to the antenna coil 2 of the aforementioned IC card 10A, which is rectangularly wound, it has virtually the same constitution as the IC card 10A. In other words, the capacitor terminal 5c, which is connected to the terminal 3b on the IC chip 3 via the wiring 7 and the through-hole 8b, is furnished from the electrode 6a on the bottom side of the mica film 1, in addition to the capacitor terminal 5b which is connected to the outer terminal 2b of the antenna coil 2 via the through-hole 8c. On the other hand, the capacitor terminal 5a which is connected to the other terminal 3a of the IC chip 3 is formed from the electrode 6b on the top side of the mica film 1, and this capacitor terminal 5a is linked to the inner terminal 2a of the antenna coil 2. Therefore, in this IC card 10C, it is not necessary for the IC chip 3 to step over the antenna coil 2 between the two terminals 3a and 3b. It is also unnecessary for the total winding width of the antenna coil 2 to be kept between the two terminals 3a and 3b of the IC chip 3. Therefore, considerable latitude is provided for the design of the antenna coil 2.

A land 9 on which the terminal of the IC chip 3 lies is formed on the mica film 1 of this IC card 10C. This land 9 does not directly connect to the antenna coil 2 or the capacitor 5, but it can be utilized as an earth or other wiring terminal. Moreover, it can act as a strut for ensuring that the IC chip 3 does not unnecessarily tilt when the IC chip is mounted.

The IC card pertaining to the present invention is not limited to the aforementioned embodiments; it can assume various embodiments. As long as the mica film which serves as the dielectric of the mica capacitor is used even as a mounting substrate for the antenna coil and the IC chip, the shapes of the mica capacitor 5 electrodes 6a, 6b and antenna coil 2 as well as the shape of the terminals and positions in which they are formed can be determined as considered appropriate.

According to the IC card pertaining to the present invention, a mica capacitor is used, enabling the resonance frequency to be stabilized, and moreover, a mica film, which serves as a dielectric of the mica capacitor, is used as a substrate on which the antenna coil and IC chip are mounted, enabling the IC card profile to be reduced and the costs of manufacture lowered.

The disclosure of the specification, claims and drawings in Japanese Patent Application No. 11-214954 filed on Jul. 29, 1999 is hereby incorporated by reference.

What is claimed is:

1. An IC card, comprising:
    a mica capacitor comprising a mica film acting as a dielectric of said mica capacitor, electrodes formed on both sides of said mica film, an antenna coil, and an IC chip;

wherein:
        said mica film acts as a substrate on which said antenna coil and said IC chip are provided, and stablizes a resonant frequency of said IC card as a result of a low water absorption rate of said mica film;
        a first capacitor terminal is connected to a first terminal of said IC chip and is linked to a first terminal of said antenna coil; a second capacitor terminal is connected to a second terminal of said IC chip; and a third capacitor terminal is connected to a second terminal of said antenna coil; and
        said IC chip is mounted on said mica film inside of said antenna coil, such that said IC chip does not overlay said antenna coil.

2. The IC card according to claim 1, wherein said antenna coil and one electrode of said mica capacitor are simultaneously formed by printing a conductive paste on said mica film.

3. The IC card according to claim 1, wherein:

said IC card is sealed with a resin;

said sealed IC card has a first side and a second side;

said first side is laminated with an outer layer film; and said second side is laminated with a release paper.

* * * * *